United States Patent [19]

Pavlis

[11] 4,128,812
[45] Dec. 5, 1978

[54] PHASE DISCRIMINATOR

[75] Inventor: James D. Pavlis, Gaithersburg, Md.

[73] Assignee: The United States of America as represented by the Secretary of the Army, Washington, D.C.

[21] Appl. No.: 823,078

[22] Filed: Aug. 9, 1977

[51] Int. Cl.$^2$ ............................................. H03D 13/00
[52] U.S. Cl. .................................... 328/134; 307/232; 324/83 D
[58] Field of Search ................ 328/133, 134; 307/232; 324/83 A, 83 D

[56] References Cited

U.S. PATENT DOCUMENTS

| | | | |
|---|---|---|---|
| 3,328,688 | 6/1967 | Brooks | 328/133 X |
| 3,430,148 | 2/1969 | Miki | 328/133 |
| 3,532,994 | 10/1970 | Ferrier | 328/134 X |
| 3,755,746 | 8/1973 | Hogue et al. | 328/133 |
| 3,805,153 | 4/1974 | Gallant | 324/83 A |
| 3,813,604 | 5/1974 | Denoncourt | 307/232 X |
| 3,854,117 | 12/1974 | Fothergill | 328/133 X |

Primary Examiner—John S. Heyman
Attorney, Agent, or Firm—Nathan Edelberg; Robert P. Gibson; Saul Elbaum

[57] ABSTRACT

An apparatus for providing a logical output indicative of when a signal is either in-phase with a reference signal or alternately 180° out-of-phase with a reference signal. Pulses are produced at each transition of the waveforms to be compared. A determination of their concurrence is then made and compared with a logical result of the inputs whereby a logical output indicative of whether the signals are in-phase or 180° out-of-phase is generated.

13 Claims, 5 Drawing Figures

OTHER THAN 0° OR 180°

180° CASE W/NOISE

PHASE DISCRIMINATOR

RIGHTS OF THE GOVERNMENT

This invention described herein may be manufactured, used, and licensed by or for the United States Government for governmental purposes without the payment to us of any royalty thereon.

BACKGROUND OF THE INVENTION

The present invention relates to phase comparators and more particularly to phase comparator having an output for a matched phase condition or an output for a 180° out-of-phase condition.

Phase comparators, discriminators, and detectors which respond to the phase difference between two signals are not new. Phase detectors which detect the interval between homologous edges of waveforms are disclosed in several prior art patents. One, such as U.S. Pat. No. 3,805,153 to Gallant, develops a voltage proportional to this phase difference. Others such as U.S. Pat. No. 3,599,102 to G. Mous produce pulses whose width is representative of the phase difference between the inputs. Another, U.S. Pat. No. 3,328,688 to Brooks, compares the leading edge of first of the wave signals to the trailing edge of the other and also compares the leading edge of the second signal to the trailing of the edge of the first signal to obtain a rectangular pulse whose width is proportional to the degree of phase difference.

One problem with these prior art patents is their relatively low resistance to perturbations caused by noisy environments. There are several phase detectors which have been proposed such as that disclosed in U.S. Pat. No. 3,764,902 to T. Rodine which attempt to solve this problem; however, their circuitry tends to be quite complex or unsuited for many applications.

There are also many instances, especially in military and industrial applications, when the circuit need only discriminate or detect phase at one point. That is, when the input signals are 180° out-of-phase or in other cases when the signals are exactly in-phase. At all other phase relationships the determination that the two signals are not at that selected phase relationship need only be made. Additionally, it is often necessary that the circuitry be as efficiently designed as possible, considering durability, power requirements, simplicity, and noise immunity.

The present invention utilizes a network which can be readily miniaturized and makes use of both edges of the input waveforms to provide a simple logical output indicative of the selected phase relationship. It also has that capability of being utilized in environments requiring a high degree of noise immunity.

SUMMARY OF THE INVENTION

It is therefore one object of this invention to provide a phase discriminator circuit which utilizes logic circuitry to indicate phase relationships.

Another object of this invention is to provide a phase discriminator circuit which exhibits economy of design and can easily be miniaturized.

A further object of this invention is to provide phase comparison circuitry which is capable of operating in a high noise environment.

Yet another object of this invention is to provide a circuit operative at varying frequencies which determines whether two signal inputs are 180° out-of-phase or in-phase.

The foregoing and other objects are attained in accordance with one aspect of the present invention through the provision of an electronic apparatus using logic gates and bi-stable elements which act on each transition of two input signals and produce a logic output indicative of phase relationship.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings in which.

DESCRIPTION OF THE PREFERRED EMBODIMENTS

Figure 1:
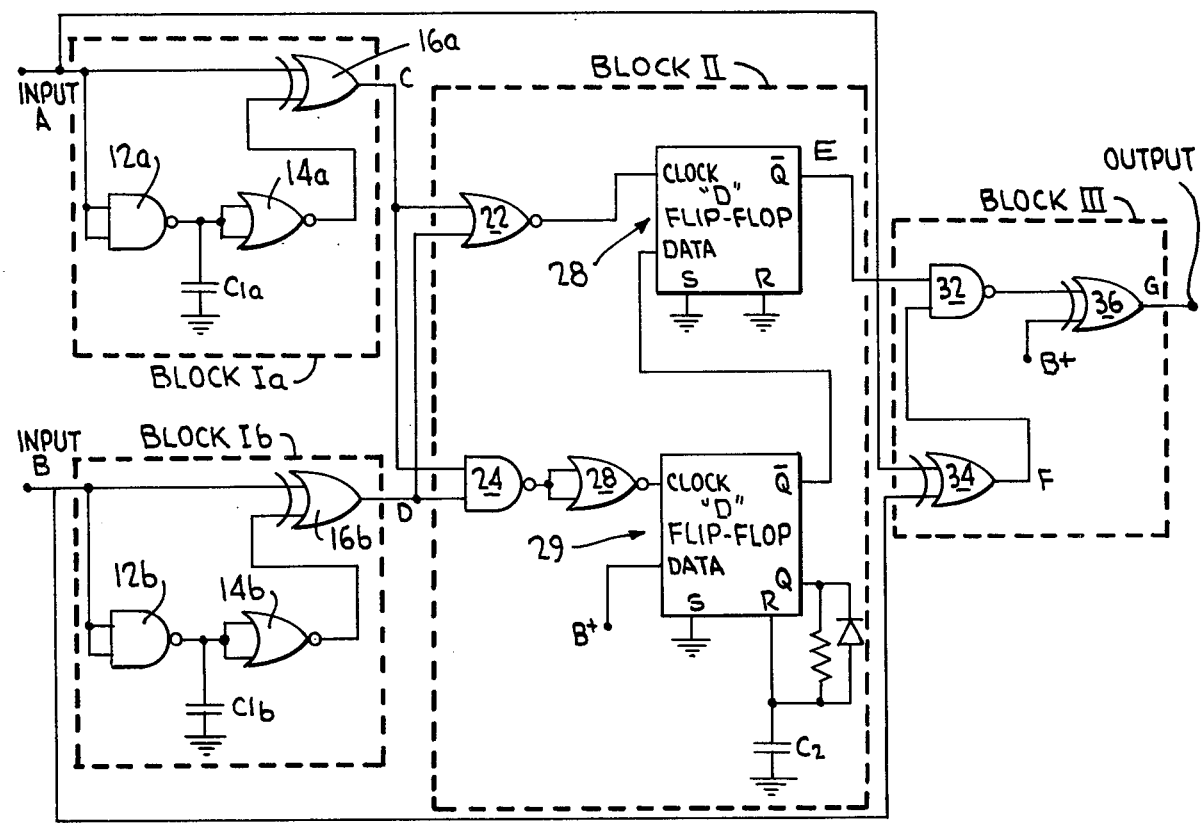
FIG. 1 illustrates schematically the phase discriminator network for the 180° out-of-phase condition upon which this invention is based.

FIG. 1 is a schematic illustration of the phase discriminator network upon which the invention is based. Fundamentally, the system can be broken into three logic blocks. As depicted in the figure, blocks Ia and Ib generate pulses at each transition of their input signals. Block II determines whether these pulses occur concurrently or not. If they do, the inputs are either in-phase or 180° out-of-phase. Block III discriminates against either in-phase or out-of-phase signals and produces a high output based upon which type of signal one wishes to discriminate against. In this embodiment a logic high is obtained when the signals are 180° out-of-phase.

Figure 2:
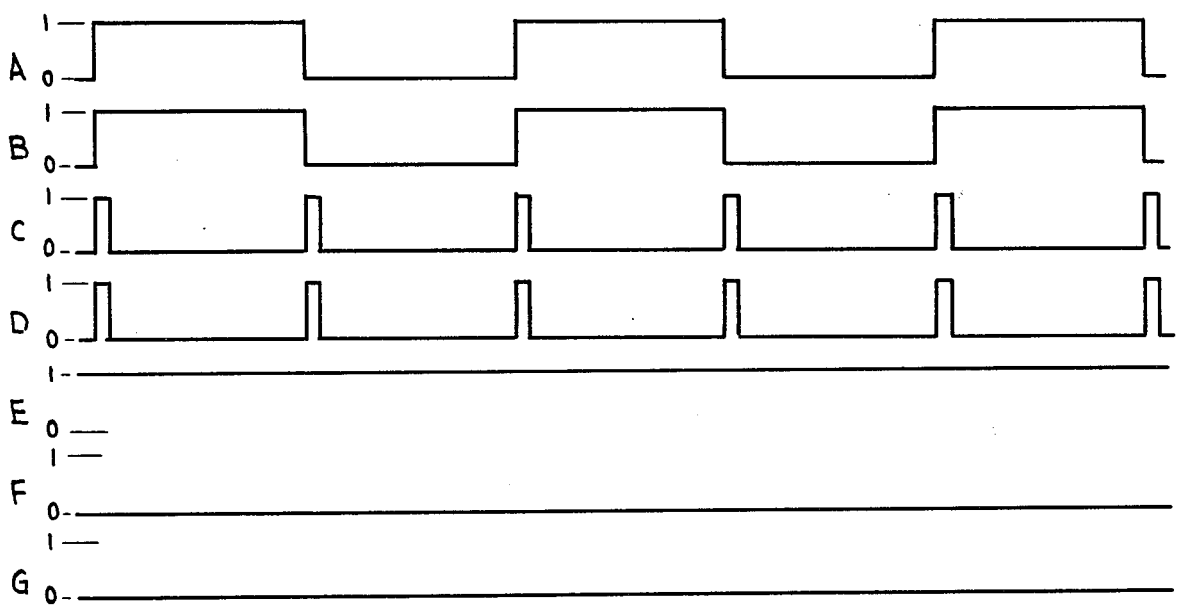
FIG. 2 illustrates graphically the case where inputs into the discriminator are exactly in-phase.
Figure 3:
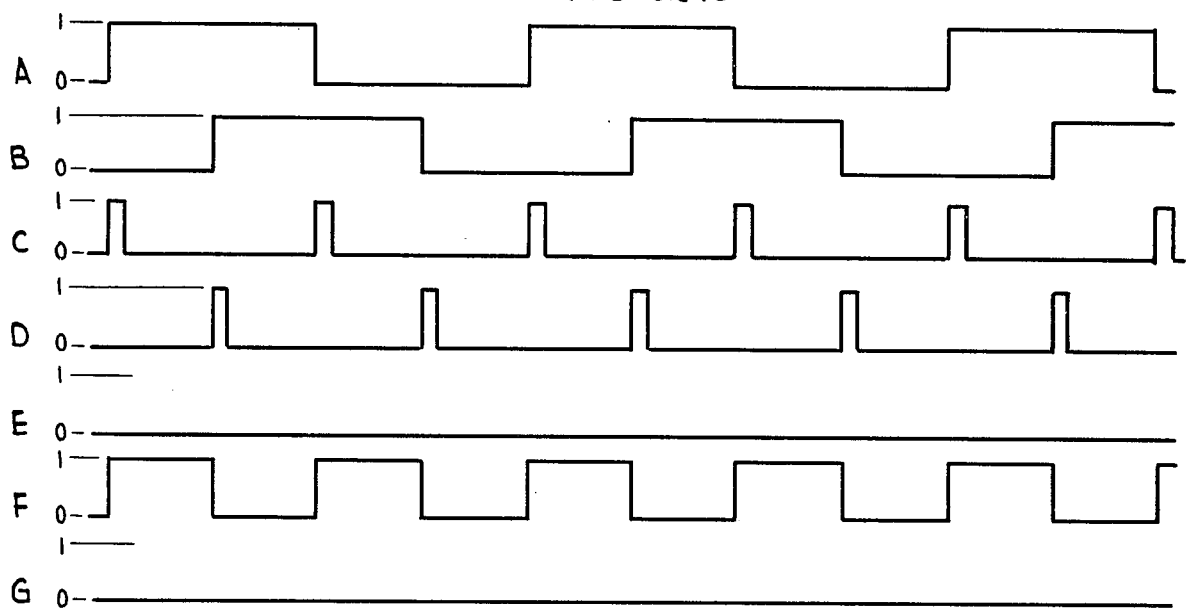
FIG. 3 illustrates graphically the case where the inputs into the discriminator are other than in-phase or 180° out-of-phase.
Figure 4:
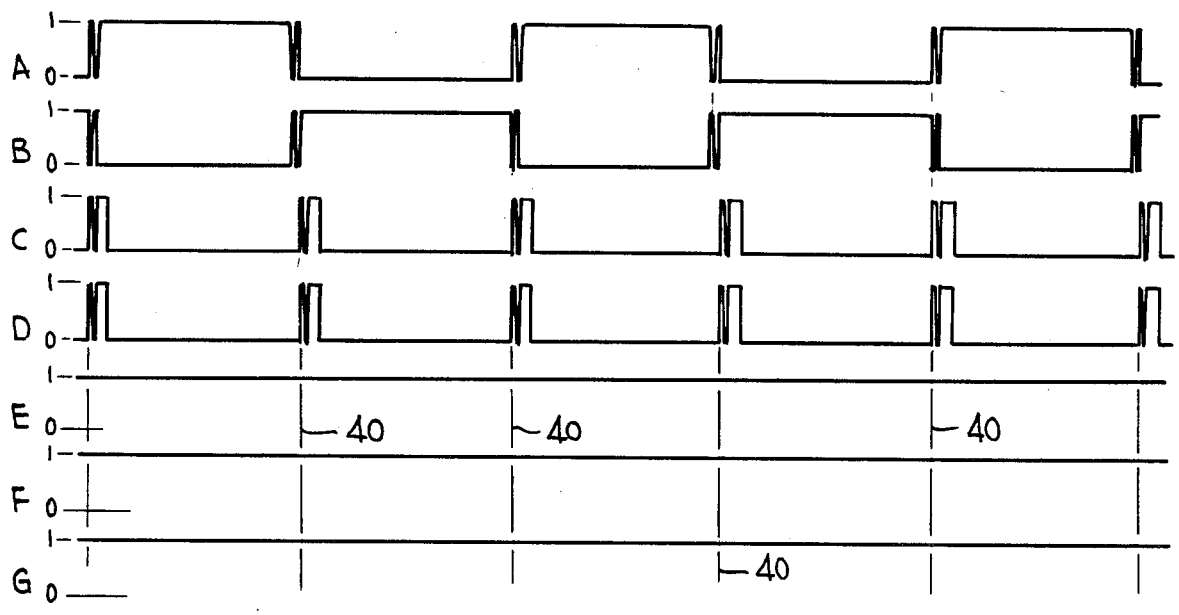
FIG. 4 illustrates graphically the case where the inputs into the discriminator are 180° out-of-phase and the system is subject to noise.

In elaborating upon the performance of each of these blocks reference will additionally be made to FIGS. 2, 3 and 4 which illustrate waveforms which are helpful in understanding the operation of this device. FIG. 2 illustrates waveforms that are in-phase, FIG. 3 illustrates waveforms that are other than in or 180° out-of-phase, and FIG. 4 illustrates the 180° out-of-phase case.

Blocks Ia and Ib are identical, each comprising NAND gate 12 $(a,b)$, NOR gate 14 $(a,b)$, an exclusive OR gate 16 $(a,b)$ and a capacitor $C_{1(a,b)}$. Basically, gates 12 and 14 and capacitor $C_1$ form a delay circuit so that when inputs A and B in FIGS. 2, 3 and 4 undergo a transition, either high to low or low to high, the signal in that line reaches gate 16 behind the signal that is fed straight through. Therefore, exclusive OR gate 16 goes high and produces a pulse whose duration is determined by capacitor $C_1$ and the gates natural impedance. This is illustrated in waveforms C and D of FIGS. 2, 3 and 4.

Block II comprises two NOR gates 22 and 26, NAND gate 24, and two "D type" flip-flops 28 and 29 such as the type manufactured by RCA (CD4013AE). The flip-flops are triggered on the leading edge of the waveforms and as seen on FIGS. 2, 3 and 4 a logic high is produced when the pulses occur concurrently. Flip-flop 28 receives its clock pulse from C and D thru NOR gate 22 and thus is only triggered when either C or D are in a transition to low. Flip-flop 29 receives the signals from C and D through a NAND and NOR gate and therefore is triggered only when C and D are both high. Since the data input of flip-flop 29 is constantly at a high, Q at the upward transition of the clock pulse will be high and $\overline{Q}$ low. The data point of bistable 28 therefore is low. The Q output of flip-flop 29 is also connected through a resistor $R_2$ to its reset and through capacitor $C_2$ to ground. Thus when Q produces a high output it triggers the reset after a period determined by the time constant rendered by $C_2$ and $R_2$. $C_2$ and $R_2$ are chosen such that the time duration is slightly longer than the pulse widths produced in blocks Ia and b. Then the reset acts to send $\overline{Q}$ from low to high, and the data input of flip-flop 28 which joined with $\overline{Q}$ of flip-flop 29 goes high also. Thus $\overline{Q}$ of bistable 28 will be high if its clock pulse occurs during the period when the RC delay circuit of flip-flop 29 is still charging (see E of FIGS. 2 and 4). However, if it occurs at any other time $\overline{Q}$ will go low and stay low as long as the pulses are not in concurrence.

Block III uses exclusive OR gate 34 to discriminate against input signals that are in-phase. As illustrated in F of FIGS. 2, 3 and 4, exclusive OR gate 34 has a "low" logic level for in-phase signal, a high logic level for 180° out-of-phase signals, and a mixture of high and low logic levels for other phase relationships. If one's wish was to obtain a discriminator for in-phase signals, one would simply invert either input into gate 34. The output from exclusive OR gate 34 and the output E from block II are applied to NAND gate 32. Both inputs to this NAND gate are a logic "high" only when the input square waves are 180° out-of-phase. After the output from 32 is inverted by 36, as seen on G of FIGS. 2, 3 and 4, a logic high is obtained at the output only when and for as long as the input signals are 180° out-of-phase.

Further reference is made to FIG. 4 which illustrates the 180° out-of-phase case with noise. Generally, due to jamming, system noise, and other deleterious effects signals tend to be "rough" at both up and down transitions of the waveform. As depicted in FIG. 4 the system described above rather successfully copes with this problem. Only a few minor perturbations (40) appear in what is otherwise a clean signal. These glitches generally will be washed out in processing or can be filtered out.

Figure 5:
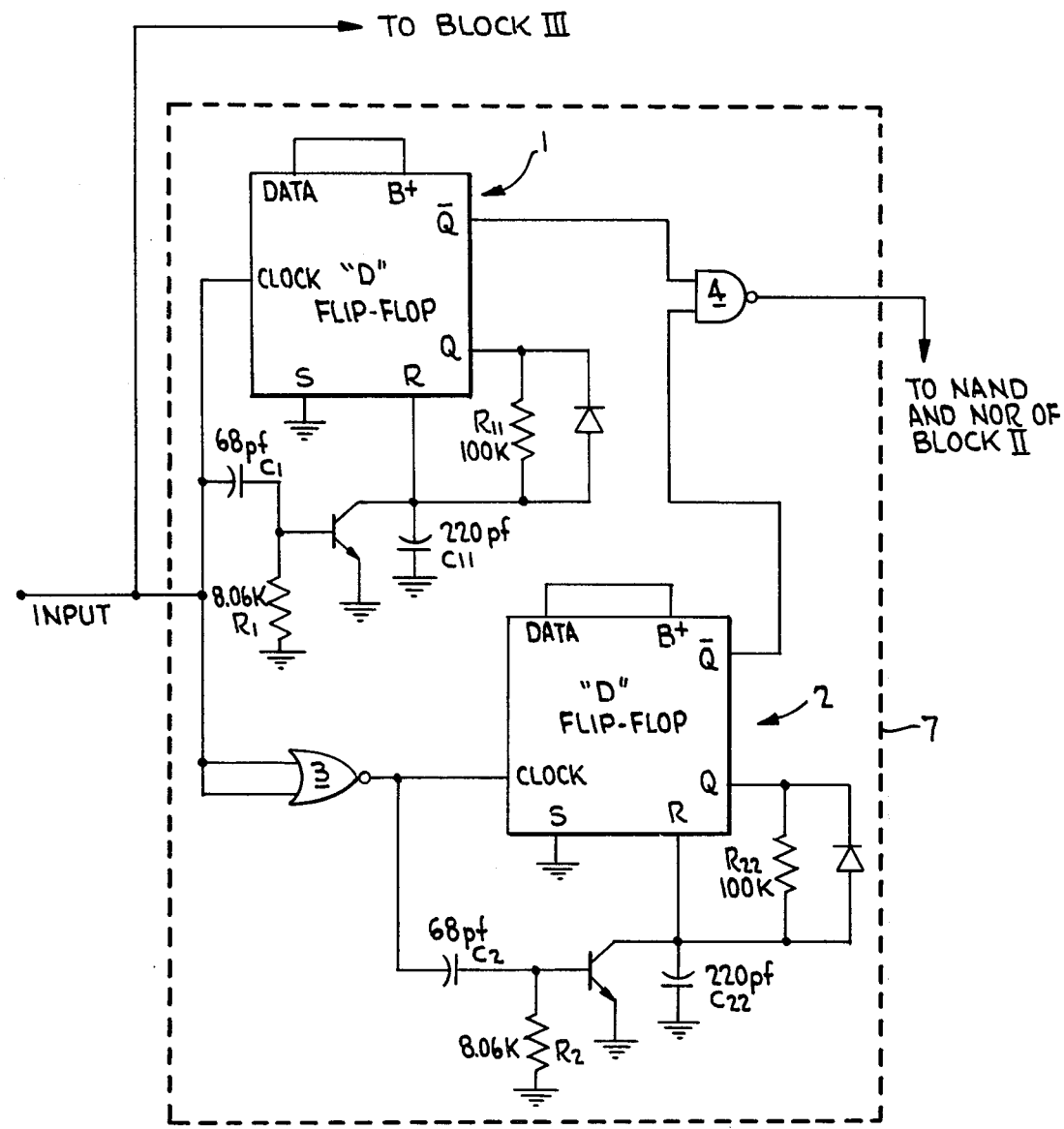
FIG. 5 illustrates schematically an alternate embodiment of one section of the present invention.

If a more precise examination is required block Ia and Ib can be modified so as to produce a clean pulse. As seen in FIG. 5 blocks Ia and Ib each can be replaced by flip-flops 1 and 2 which alternately trigger on the leading and falling edges of one of the input signals. Flip-flop 1 is triggered by the leading edge and 2 through NOR gate 3 by the trailing edge. These flip-flops are retriggerable to allow for a single output pulse on a noisy signal and to allow for upper frequency cut-off and noise cutoff. The pulses produced are sent through NAND gate 4 to yield a pulse train coinciding with each rise and fall of the input signal. The pulse width of flip-flop 1 is determined by $R_{11}$ and $C_{11}$, and the width of flip-flop 2 is determined by $R_{22}$ and $C_{22}$. $C_1$, $R_1$ and its transistor and $C_2$, $R_2$ and its transistor act on an upward transition to "reset" $C_{11}$ and $C_{22}$. The operation of the flip-flop is otherwise very similar to flip-flop 29 of FIG. 1. Likewise the operation of the entire device in this modified form is now very similar to that of FIG. 1 except the perturbations will be ameliorated.

Flip-flop pulse widths should be selected on a system basis taking into account bandwidths and tolerance on active phase shifters. The two "D" type flip-flops and associated components labeled 1 and 2 in FIG. 5 may be replaced by a retriggerable monostable.

The logic circuitry and configuration disclosed herein, of course can be substituted with equivalent circuitry without departing from the spirit and scope of the invention. Additionally numerous variations and modifications of the present invention are possible in light of the above teachings.

I claim:

1. A phase detector for detecting phase synchronism between a first reference input signal and a second input signal comprising:
   a pulse generator which generates pulses at each transition of the first and second input signals, said pulse generator comprising pulse delaying circuits each which receives the input signals, and first gating means which is coupled to receive the input signals and the outputs from the pulse delaying circuits for producing a high logical output whenever the logical levels of its inputs are not in concert;
   means coupled to the pulse generator for producing an output determinative of whether the pulses generated occur concurrently; and
   gating means which compare the first and second input signals to the output of the means for determining concurrence for producing an output indicative of phase relationship, whereby the phase relationship is determined.

2. The phase detector as recited in claim 1 wherein the pulse delaying circuit comprises:
   a NAND gate for receiving a signal input into both of its input terminals;
   a first capacitance coupled to the output of the NAND gate; and
   a NOR gate which has both of its input terminals coupled to the output of the NAND gate and a first capacitance.

3. The phase detector as recited in claim 1 wherein the means for determining concurrence comprises:
   a second gating means coupled to the outputs of the pulse generating means for producing a high logical output when the pulse generating outputs are both at a low logic level; and
   a third gating means also coupled to the outputs of the outputs of the pulse generating means for producing a high logical output when the pulse outputs are both at a high logical level;
   a first triggering means connected to the third gating means for producing a high logical pulse after a delay time once it receives a high logical pulse; and
   a second triggering means connected to the second gating means and the output of the first triggering means for producing a high logic level from the second gating means does not arrive during the period when a high logic level arrives from the second triggering means.

4. The phase detector as recited in claim 3 wherein the second gating means comprises a NOR gate.

5. The phase detector as recited in claim 3 wherein the third gating means comprises a NAND and a NOR gate.

6. The phase detector as recited in claim 3 wherein the first and second triggering means comprise "D" type flip-flops.

7. The phase detector as recited in claim 6 wherein the second triggering means also comprises a resistor which coupled to the Q and reset terminals of the flip-flop and a capacitor coupled to reset terminal.

8. The phase detector as recited in claim 3 wherein the gating means for producing an output indicative of phase relationship comprises:
   a fourth gating means which receives the input signals and produces a logic high when either one is at a logic low and the other one is at a logic high; and
   a fifth gating means which receives the output from the fourth gating means and the means for determining whether the pulses occur concurrently for providing a high logic level when both these inputs are at a high logic level.

9. The phase detector as recited in claim 8 wherein one of the input signals is inverted.

10. The phase detector as recited in claim 1 wherein the pulse generator comprises a pair of flip-flops, one of which is triggerable on the leading edge of the input waveform and the other of which is triggerable on the falling edge of the input waveform.

11. The phase detector as recited in claim 10 wherein the pulse generator also comprises a gating means coupled to the output of the flip-flops for producing a train of pulses coinciding with each rise and fall of the input pulses.

12. The phase detector as recited in claim 11 wherein the flip-flops are "D" type flip-flops.

13. The phase detector as recited in claim 11 wherein the flip-flops also comprise a means for producing pulses of desired width.

* * * * *